(12) United States Patent
Wang et al.

(10) Patent No.: US 7,932,533 B2
(45) Date of Patent: Apr. 26, 2011

(54) PIXEL STRUCTURE

(75) Inventors: Liang-Yuan Wang, Taipei County (TW); Chih-Kwang Tzen, Pingtung County (TW); Pei-Lin Huang, Hsinchu (TW); Yi-Lung Kao, Taoyuan County (TW); Ya-Ping Tsai, Nantou County (TW); Shuenn-Jiun Tang, Hsinchu County (TW)

(73) Assignee: Chunghwa Picture Tubes, LTD., Taoyuan (TW)

( * ) Notice: Subject to any disclaimer, the term of this patent is extended or adjusted under 35 U.S.C. 154(b) by 0 days.

(21) Appl. No.: 12/686,345

(22) Filed: Jan. 12, 2010

(65) Prior Publication Data

US 2010/0117529 A1 May 13, 2010

Related U.S. Application Data

(62) Division of application No. 11/162,528, filed on Sep. 14, 2005, now Pat. No. 7,675,078.

(51) Int. Cl.
*H01L 31/0216* (2006.01)
*H01L 31/0232* (2006.01)

(52) U.S. Cl. .... 257/98; 257/294; 257/440; 257/E31.123

(58) Field of Classification Search ............... 257/98, 257/294, 440, E31.121, E31.123; 438/35, 438/956; 372/50.11; 362/269.01, 296.02
See application file for complete search history.

(56) References Cited

U.S. PATENT DOCUMENTS

| | | | | |
|---|---|---|---|---|
| 5,684,365 A * | 11/1997 | Tang et al. | 315/169.3 |
| 5,834,893 A * | 11/1998 | Bulovic et al. | 313/506 |
| 6,046,543 A | 4/2000 | Bulovic et al. | 313/504 |
| 6,111,270 A * | 8/2000 | Xu et al. | 257/72 |
| 6,111,361 A * | 8/2000 | Xu et al. | 315/169.1 |
| 6,589,672 B1 * | 7/2003 | Kobayashi et al. | 428/690 |
| 6,686,692 B1 * | 2/2004 | Tanaka et al. | 313/504 |
| 6,849,869 B1 * | 2/2005 | O'Regan et al. | 257/40 |
| 6,873,091 B2 * | 3/2005 | Bechtel et al. | 313/112 |
| 7,675,078 B2 * | 3/2010 | Wang et al. | 257/98 |
| 2002/0093284 A1 * | 7/2002 | Adachi et al. | 313/506 |
| 2004/0016932 A1 * | 1/2004 | Kondo | 257/80 |
| 2004/0036078 A1 * | 2/2004 | Kondo | 257/80 |
| 2004/0048447 A1 * | 3/2004 | Kondo | 438/458 |
| 2004/0140757 A1 * | 7/2004 | Tyan et al. | 313/504 |
| 2005/0112405 A1 * | 5/2005 | Hamada | 428/690 |
| 2006/0066220 A1 * | 3/2006 | Choong et al. | 313/501 |
| 2006/0066228 A1 * | 3/2006 | Antoniadis et al. | 313/506 |
| 2006/0097275 A1 * | 5/2006 | Tsai et al. | 257/98 |
| 2007/0046180 A1 * | 3/2007 | Kao et al. | 313/504 |
| 2007/0057251 A1 * | 3/2007 | Wang et al. | 257/40 |
| 2010/0117529 A1 * | 5/2010 | Wang et al. | 313/505 |

* cited by examiner

*Primary Examiner* — David Vu
*Assistant Examiner* — Earl N Taylor
(74) *Attorney, Agent, or Firm* — Jianq Chyun IP Office

(57) ABSTRACT

A pixel structure driven by a scan line and a data line arranged on a substrate is provided. The pixel structure includes a control unit, an OEL unit and a semi-transparent reflector structure. The control unit driven by the scan line and the data line is arranged on the substrate. The OEL unit is arranged on the substrate and includes a transparent electrode, a light-emitting layer and a metal electrode. The transparent electrode is electrically connected with the control unit. The light-emitting layer is disposed on the transparent electrode. The metal electrode is disposed on the light-emitting layer. The semi-transparent reflector structure is sandwiched between the substrate and the OEL unit, and includes at least a plurality of first and second dielectric layers. The first and second dielectric layers are alternately stacked, and the refractive index of the first dielectric layers is different from that of the second dielectric layers.

11 Claims, 8 Drawing Sheets

PIXEL STRUCTURE

CROSS-REFERENCE TO RELATED APPLICATION

This application is a divisional application of and claims priority benefit of an application Ser. No. 11/162,528, filed on Sep. 14, 2005, now allowed. The entirety of the above-mentioned patent application is hereby incorporated by reference herein and made a part of this specification.

BACKGROUND OF THE INVENTION

1. Field of the Invention

The invention generally relates to a pixel structure. More particularly, the invention relates to the pixel structure of an active matrix organic electro-luminescent display.

2. Description of Related Art

Information technology has become a mainstream industry in our society, thanks to the development of various portable communication and display products. Because the display panel is an indispensable communication interface for man to acquire information, its development is particularly important. Among the display panels, organic electro-luminescent display (OELD) has the greatest potential to become the major display product in the next generation, with the advantages including self-illuminating screen, wide viewing angle, low power consumption, simple manufacturing process, low cost, a wide operating temperature range, a high response speed and full-color display.

The organic electro-luminescent display (OELD) utilizes the self-illuminating property of the organic light-emitting material to display an image. According to the molecular weight of the organic light-emitting material, the OELD panel can be classified into small molecule organic electro-luminescent display (SM-OELD) and polymer electro-luminescent display (PELD). The light-emitting structure of both types of OELD comprises a pair of electrodes and an organic material layer sandwiched between the two electrodes. When a DC voltage is applied to the electrodes, holes are injected from the anode into the organic light-emitting material layer while electrons are injected from the cathode into the organic light-emitting material layer. Due to the electric potential difference produced by an external electric field, hole and electron carriers moving inside the organic light-emitting material layer may collide and trigger radiative recombination. A portion of the energy released by the recombination of the electron and hole may excite the organic light-emitting molecules into an excited state. When the excited molecule releases its energy and returns to a ground state, a definite portion of the energy is released as photons to emit light. Accordingly, the organic electro-luminescent display (OELD) panel emits light following this principle.

FIG. 1A is a cross-sectional view showing a pixel structure of a conventional active matrix-type OLED. FIG. 1B shows a relationship between the wavelength and transmittance of the light-emitting layer shown in FIG. 1A. Please refer to FIG. 1A, the conventional pixel structure 100 is controlled by a scan line and a data line arranged on a substrate 110. The pixel structure 100 comprises a plurality of amorphous silicon thin film transistors (a-Si TFT) 120a and 120b, a plurality of dielectric layers 130 and 140, an organic electro-luminescent unit 150 and a pixel define layer 160. The a-Si TFT 120a and 120b are arranged on the substrate 110 and are electrically connected with each other, in order to control the organic electro-luminescent unit 150. The dielectric layer 140 made of silicon nitride is arranged over the a-Si TFT 120a and 120b. Besides, the organic electro-luminescent unit 150 and the pixel define layer 160 are arranged on the dielectric layer 140 respectively.

More specifically, the a-Si TFT 120a and 120b comprise gate electrodes 122a and 122b, channel layers 124a and 124b, source/drain electrodes 126a and 126b, respectively. The gate electrodes 122a and 122b are arranged on the substrate 110. The dielectric layer 130 arranged on the substrate 110 covers the gate electrodes 122a and 122b. The channel layers 124a and 124b are disposed on the dielectric layer 130. The source/drain electrodes 126a and 126b are arranged on the channel layers 124a and 124b, respectively. In addition, the organic electro-luminescent unit 150 comprises a transparent electrode 152, a light-emitting layer 154 and a metal electrode 156. The transparent electrode 152 is electrically connected to the a-Si TFT 120b. The light-emitting layer 154 and the metal electrode 156 are sequentially arranged on the transparent electrode 152.

As shown in FIGS. 1A and 1B, a light emitted from the light-emitting layer 154 travels through the transparent electrode 152, the dielectric layer 130 and 140 and the substrate 110 toward the outside of the OLED. As shown in FIG. 1B, the average transmittance of red light (640 nm), green light (515 nm) and blue light (470 nm) in the conventional pixel structure is about 97%. So, the dielectric layers 130 and 140 have little influence on the light emitted from the organic electro-luminescent unit 150. In other words, the display quality of the active matrix-type OLED having the conventional pixel structure 100 is restricted by the characteristics of the organic electro-luminescent unit 150. Compared with the a-Si TFT 120a and 120b, a low temperature poly silicon (LTPS) TFT has the advantages of higher carrier mobility and lower operation voltage, thus another pixel structure applied in the active matrix-type OLED has been developed.

FIG. 2A is a cross-sectional view showing another pixel structure applied in a conventional active matrix-type OLED. FIG. 2B shows the relationship between the wavelength and transmittance of the emitting layer shown in FIG. 2A. Please refer to FIG. 2A, the pixel structure 200 is controlled by a scan line and a data line arranged on a substrate 210. The conventional pixel structure 200 comprises a plurality of LTPS thin film transistors 230a and 230b, a plurality of dielectric layers 220, 240, 250 and 260, an organic electro-luminescent unit 150 and a pixel define layer 160. The LTPS thin film transistors 230a and 230b are electrically connected with each other. The organic electro-luminescent unit 150 is controlled by the LTPS thin film transistors 230a and 230b. The dielectric layer 220 is arranged on the substrate 210. Then, the LTPS thin film transistors 230a and 230b are arranged on the dielectric layer 220. Besides, the dielectric layer 260 is over the LTPS thin film transistors 230a and 230b. The organic electro-luminescent unit 150 and the pixel define layer 160 are arranged on the dielectric layer 260 respectively.

More specifically, the LTPS thin film transistors 230a and 230b comprise gate electrodes 232a and 232b, channel layers 234a and 234b, source/drain electrodes 236a and 236b respectively. The channel layers 234a and 234b are disposed on the dielectric layer 220. The dielectric layer 220 could prevent the metal ions inside the substrate 210 from diffusing to the channel layers 234a and 234b. The dielectric layer 240 is disposed over the channel layers 234a and 234b, and the source/drain electrodes 236a and 236b are arranged above the channel layers 234a and 234b respectively. It should be noted that the gate electrodes 232a and 232b are arranged on the dielectric layer 240, and the LTPS thin film transistors 230a and 230b are both dual-gate thin film transistor structures. But the LTPS thin film transistors 230a and 230b can also be single gate thin film transistor structures. The dielectric layer 250 is arranged over the gate electrodes 232a and 232b. The dielectric layer 260 is arranged on the dielectric layer 250.

As shown in FIGS. 2A and 2B, a light emitted from the light-emitting layer 154 travels through the transparent electrode 152, the dielectric layer 260, 250, 240 and 220, and the substrate 210 toward the outside of the OLED. The dielectric layers 260 and 250 are made of silicon nitride, and the dielectric layer 240 is made of silicon dioxide. The material of dielectric layer 240 can be silicon dioxide/silicon nitride. As shown in FIG. 2B, the transmittance of a specific light (500 nm) and a red light (640 nm) with respect to the conventional pixel structure 200 are about 96% and 83% respectively. That is, the luminance characteristics of the organic electro-luminescent unit 150 will be affected by the dielectric layers 240 and 220.

SUMMARY OF THE INVENTION

Accordingly, the invention is directed to a pixel structure having better color purity.

The invention is also directed to providing a pixel structure having higher light intensity and better color purity.

According to an embodiment of the invention, a pixel structure controlled by a scan line and a data line arranged on a substrate is provided. The pixel structure comprises a control unit, an OEL unit and a filter structure. The control unit is arranged on the substrate and is driven by the scan line and the data line. The OEL unit is arranged on the substrate and includes a transparent electrode, a light-emitting layer and a metal electrode. The transparent electrode is electrically connected with the control unit, and the light-emitting layer and the metal electrode are sequentially stacked on the transparent electrode. The filter structure is sandwiched between the substrate and the OEL unit, and it at least comprises a plurality of first and second dielectric layers. The first and second dielectric layers are alternately stacked, and the refractive index of the first dielectric layers is different from that of the second dielectric layers.

According to an embodiment of the invention, the material of the mentioned first dielectric layers can be silicon nitride or titanic, and the material of the second dielectric layers can be silicon dioxide.

According to an embodiment of the invention, the first dielectric layers and the second dielectric layers are sandwiched between the substrate and the OEL unit, and are extended to the top of the control unit.

According to an embodiment of the invention, the mentioned filter structure further comprises a third dielectric layer. The third dielectric layer is extended from the bottom of the first and second dielectric layers to the control unit, and it is a single layer or a multi-layer structure. Besides, the filter structure further comprises a fourth dielectric layer over the control unit. The fourth dielectric layer extends below the bottom of the first and second dielectric layers and above the third dielectric layer. The fourth dielectric layer can be a single layer or a multi-layer structure. In addition, the total thickness of the first and second dielectric layers is larger than and equal to that of the third and fourth dielectric layers.

According to an embodiment of the invention, the mentioned control unit comprises a plurality of active devices. The active devices are electrically connected to each other, and they can be amorphous silicon thin film transistors or low temperature poly-silicon thin film transistors.

According to an embodiment of the invention, the pixel structure further comprises a pixel define layer arranged upon the control unit and a portion of the transparent electrode.

According to another embodiment of the invention, a pixel structure driven by a scan line and a data line arranged on a substrate is provided. The pixel structure comprises a control unit, an OEL unit and a semi-transparent reflector structure. The control unit driven by the scan line and the data line is arranged on the substrate. The OEL unit is also arranged on the substrate and comprises a transparent electrode, a light-emitting layer and a metal electrode. The transparent electrode is electrically connected with the control unit. The light-emitting layer is disposed on the transparent electrode, and the metal electrode is disposed on the light-emitting layer. The semi-transparent reflector structure is sandwiched between the substrate and the OEL unit, and it comprises at least a plurality of first and second dielectric layers. The first and second dielectric layers are alternately stacked, and the refractive index of the first dielectric layers is different from that of the second dielectric layers.

According to an embodiment of the invention, the optical thickness of each mentioned first and second dielectric layers is N times of a quarter of a wavelength, wherein N is an integer.

According to an embodiment of the invention, the first and second dielectric layers comprise silicon nitride and silicon dioxide respectively.

According to an embodiment of the invention, the mentioned semi-transparent reflector structure further comprises a middle layer arranged in the middle of the first and second dielectric layers, and the refractive index of the middle layer is larger than that of the second dielectric layers. Besides, the middle layer comprises silicon nitride or titania.

According to an embodiment of the invention, the first dielectric layers and the second dielectric layers are sandwiched between the substrate and the OEL unit, and are extended to the top of the control unit.

According to an embodiment of the invention, the semi-transparent reflector structure further comprises a third dielectric layer. The third dielectric layer extends from the bottom of the first and second dielectric layers to the control unit, and it can be a single layer or multi-layer structure. In addition, the semi-transparent reflector structure further comprises a fourth dielectric layer over the control unit. The fourth dielectric layer extends below the bottom of the first and second dielectric layers and above the third dielectric layer, and it can be a single layer or multi-layer structure. Further, the total thickness of the first and second dielectric layers is larger than and equal to that of the third and fourth dielectric layers.

According to an embodiment of the invention, the control unit comprises a plurality of active devices, and the active devices are electrically connected to each other. Besides, the active devices can be an amorphous silicon thin film transistor or a low temperature poly-silicon thin film transistor.

According to an embodiment of the invention, the pixel structure further comprises a pixel define layer arranged above the control unit and a portion of the transparent electrode.

In the invention, a filter structure or a semi-transparent reflector structure having a plurality of dielectric layers with different refractive indices is sandwiched between the OEL unit and the substrate, to improve the color purity and the light intensity. Because the filter structure and the semi-transparent reflector structure are both multi-dielectric-layer structure, it's easier to planarize the filter structure and the semi-transparent reflector structure.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention.

DESCRIPTION OF THE EMBODIMENTS

Figure 1A:
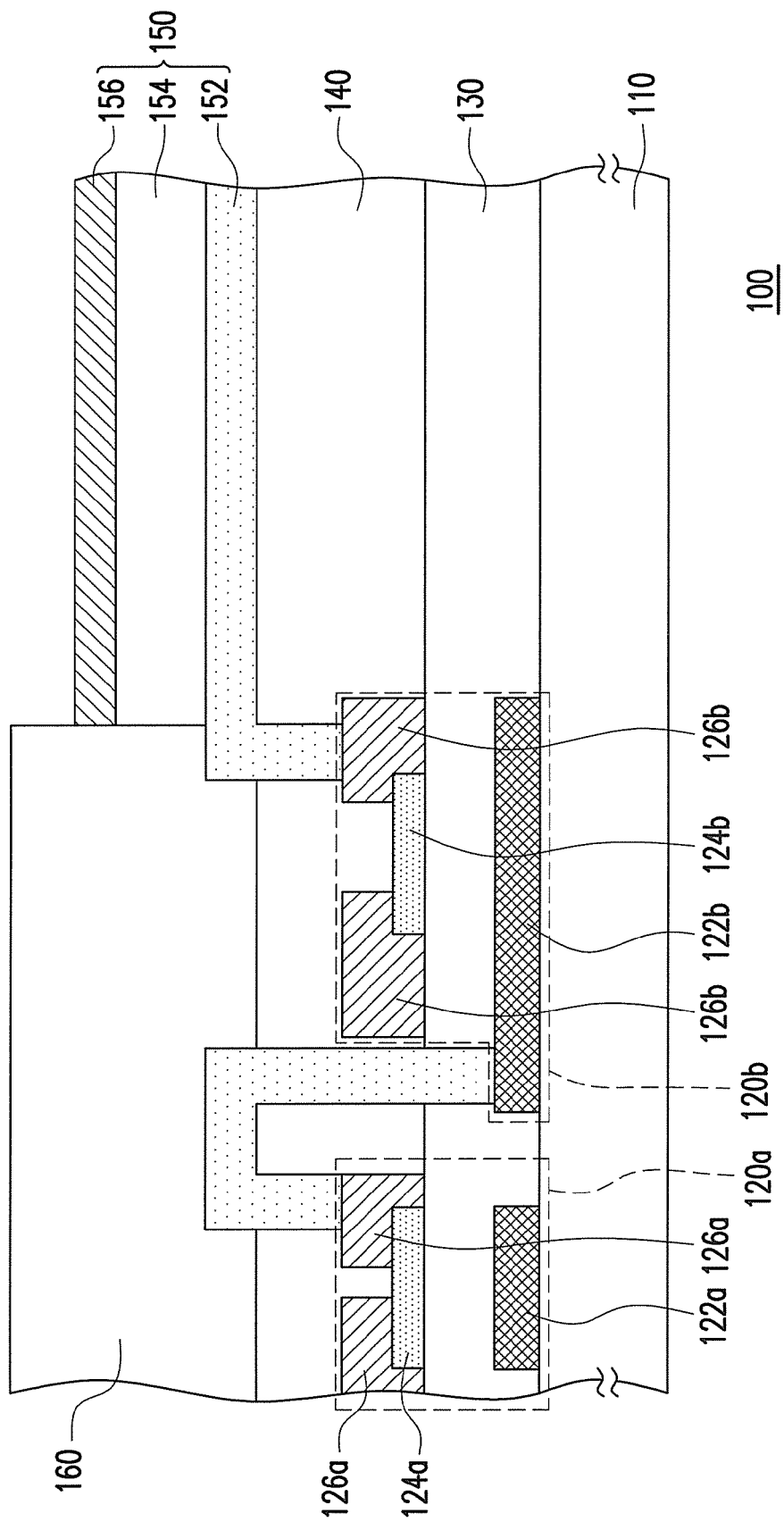
FIG. 1A is a schematic cross-sectional view showing a pixel structure of a conventional active matrix-type OLED.
Figure 1B:
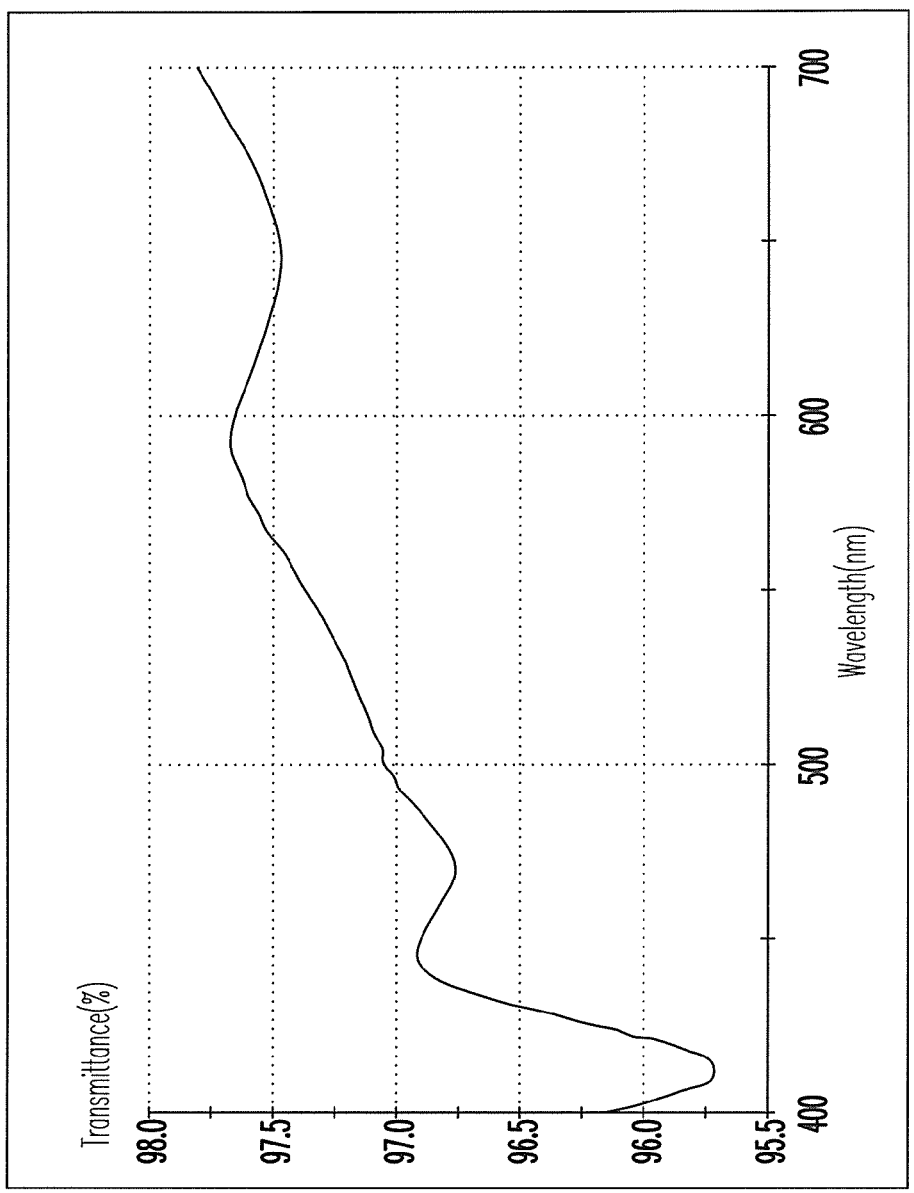
FIG. 1B shows a relationship of the wavelength and transmittance of the active matrix-type OLED shown in FIG. 1A.
Figure 2A:
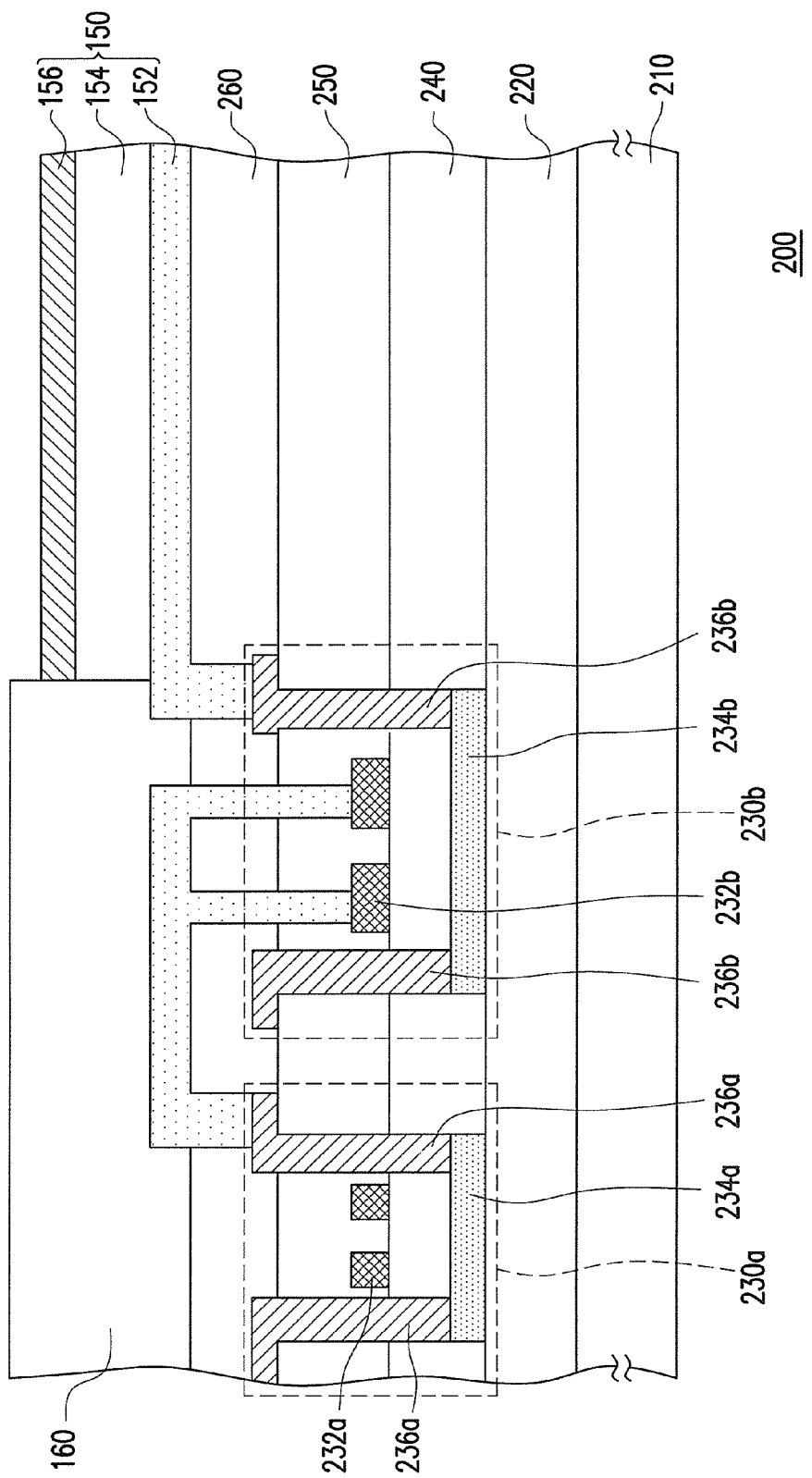
FIG. 2A is a schematic cross-sectional view showing another pixel structure applied to a conventional active matrix-type OLED.
Figure 2B:
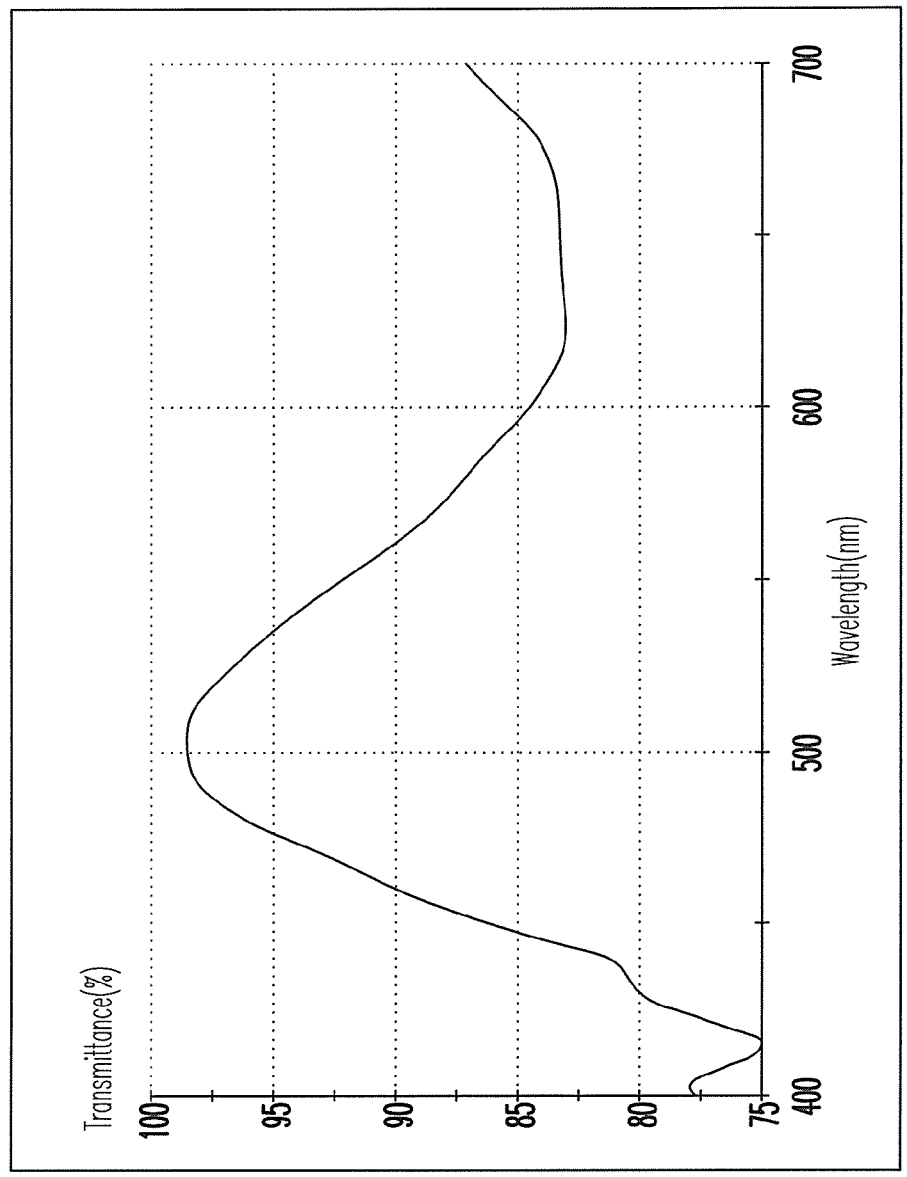
FIG. 2B shows a relationship of the wavelength and transmittance of the emitting layer shown in FIG. 2A.

Reference will now be made in detail to the present embodiments of the invention, examples of which are illustrated in the accompanying drawings. Wherever possible, the same reference numbers are used in the drawings and the description to refer to the same or like parts.

First Embodiment

Figure 3A:
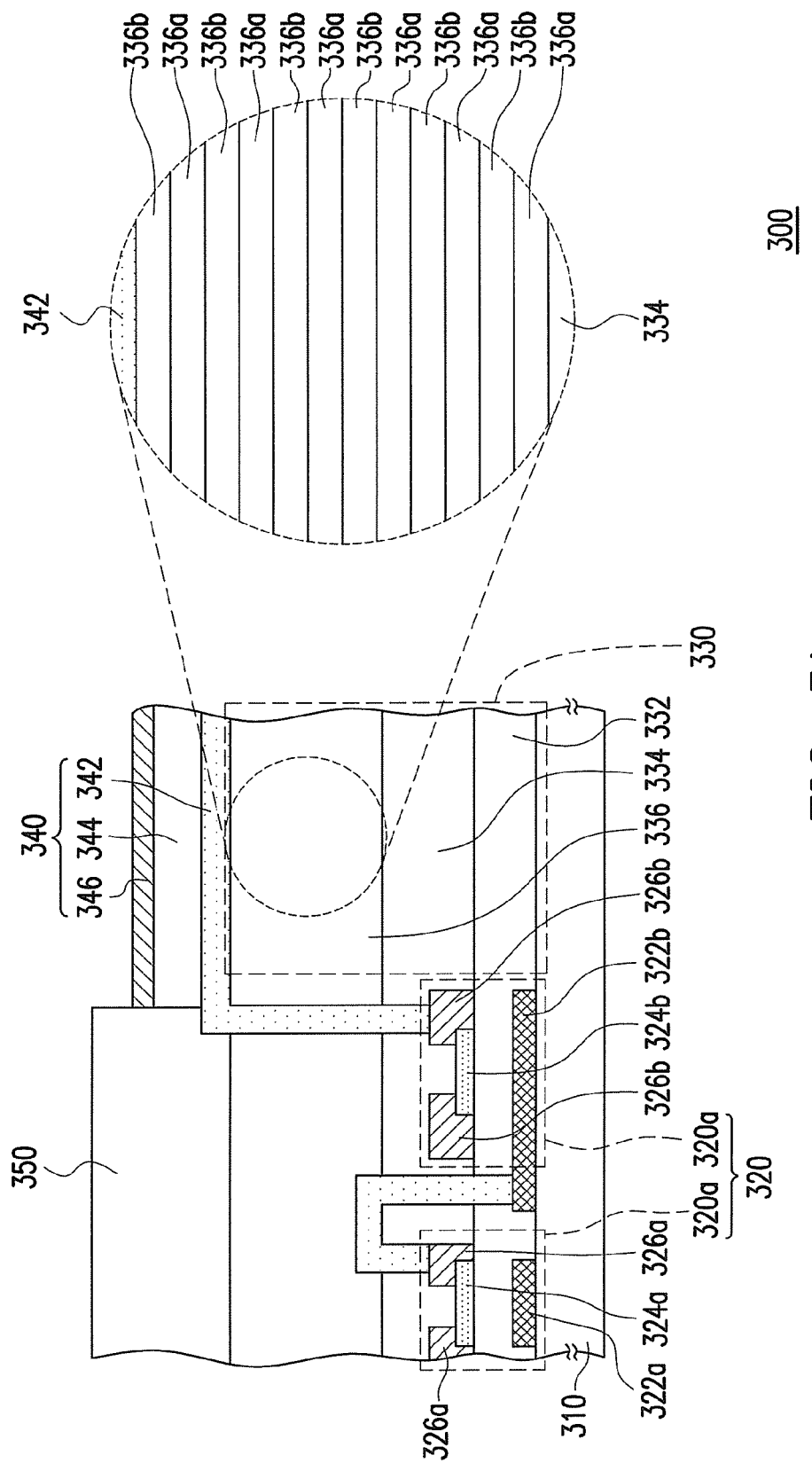
FIG. 3A is a schematic cross-sectional view showing a pixel structure according to the first embodiment of the invention.
Figure 3B:
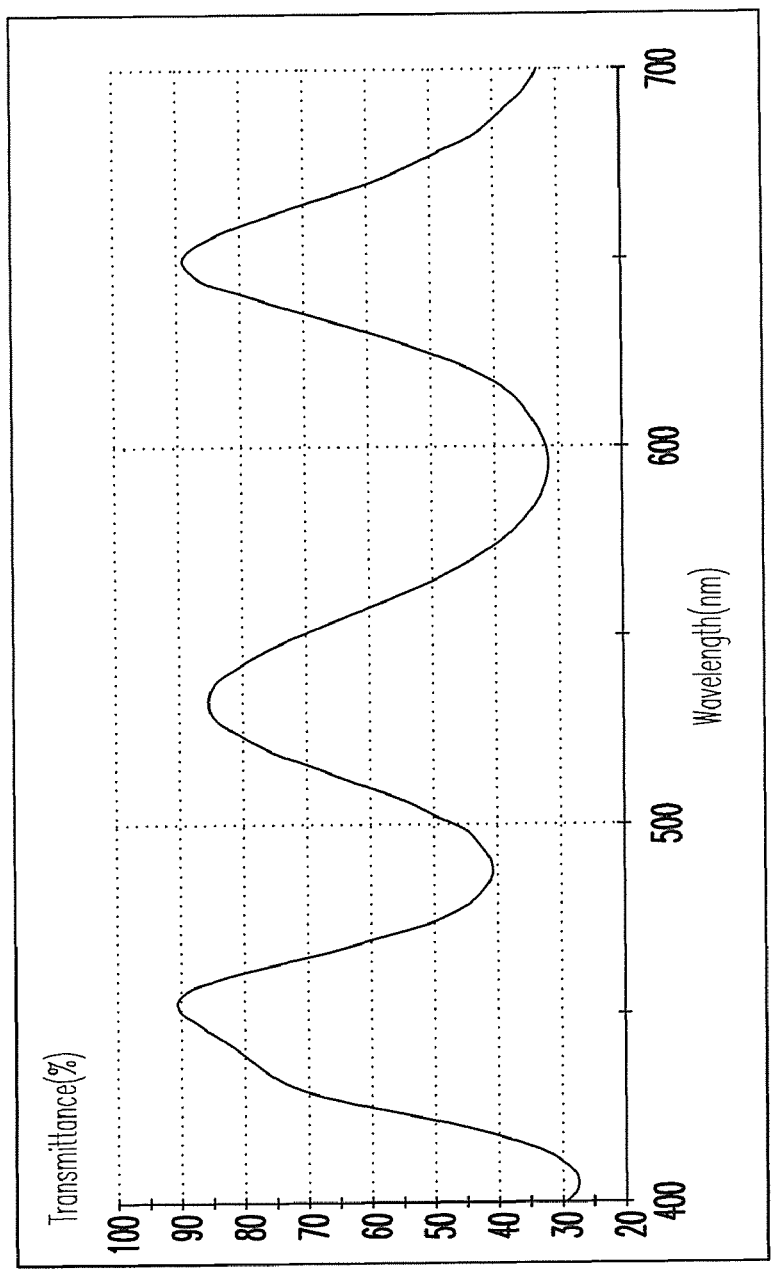
FIG. 3B shows a relationship of the wavelength and transmittance of the pixel structure shown in FIG. 3A.

FIG. 3A is a schematic cross-sectional view showing a pixel structure according to the first embodiment of the invention. FIG. 3B shows a relationship of the wavelength and transmittance of the pixel structure shown in FIG. 3A. Please refer to FIG. 3A, the pixel structure 300 of the invention may apply to an active matrix OLED. The pixel structure 300 is controlled by a scan line and a data line arranged on a substrate 310. The pixel structure 300 comprises a control unit 320, an OEL unit 340 and a filter structure 330. The control unit 320 is arranged on the substrate 310 and is driven by the scan line and the data line.

The control unit 320 may comprise a plurality of a-Si TFT 320a and 320b, and the a-Si TFT 320a and 320b are electrically connected with each other. The a-Si TFT 320a and 320b have gate electrodes 322a and 322b, channel layers 324a and 324b, and source electrode/drain electrode 326a and 326b respectively. The gate electrodes 322a and 322b are disposed over the substrate 310. The dielectric layer 332 is arranged on the substrate 310 and is over the gate electrodes 322a and 322b. The dielectric layer 332 is disposed inside the a-Si TFT 320a and 320b and is extended between the OEL unit 340 and the substrate 310. Besides, the dielectric layer 332 can be a single layer or multi-layer structure. The dielectric layer 332 can be a single layer structure made of silicon nitride or a multi-layer structure made of silicon nitride/silicon dioxide. However, the material of the dielectric layer 332 is not limited to silicon nitride or silicon dioxide.

The channel layer 324a and 324b are arranged on the dielectric layer 332, and the source electrode/drain electrode 326a and 326b are arranged on the channel layer 324a and 324b respectively. Specially, the control unit 320 can be composed of a plurality of LTPS thin film transistors or other types of active device. The control unit 320 may have a top gate or a bottom gate. Otherwise, a part of the control unit 320 may have a top gate and others may have a bottom gate. Besides, the structure of the a-Si TFT 320a and 320b and electrical connection method between the a-Si TFT 320a and 320b are not restricted to what is shown in FIG. 3A. The dielectric layer 334 is disposed over the a-Si TFT 320a and 320b and is extended between the OEL unit 340 and the dielectric layer 332. Further, the dielectric layer 334 can be a single layer structure made of silicon nitride or a multi-layer structure made of silicon nitride/silicon dioxide.

The dielectric layer 336 covering the control unit 320 is arranged between the OEL unit 340 and the dielectric layer 334. More specifically, the dielectric layers 336a and 336b with different refractive indices are alternately stacked to form the dielectric layer 336. The refractive index of the dielectric layers 336a is different from that of the dielectric layers 336b. In addition, the dielectric layers 336a comprise silicon nitride or titania, and the dielectric layers 336b comprise silicon dioxide.

It should be noted that the dielectric layers 332, 334 and 336 sandwiched between the OEL unit 340 and the substrate 310 form the filter structure 330. The characteristics of the control unit 320 are controlled by the thickness of the dielectric layer 332 or 334. Therefore, the total thickness of the dielectric layer 336 is larger than or equal to that of the dielectric layers 332 and 334, to achieve a specific filtering effect. Besides, the dielectric layer 336 is composed of six dielectric layers 336a and six dielectric layers 336b. The filter effect is better with more dielectric layers of the filter structure 330. In addition, the dielectric layer 336 can comprise multiple dielectric layers with different refractive indices and is not limited to only the dielectric layers 336a and 336b with two refractive indices. Further, the stacking sequence of the dielectric layers 336a and 336b can be reversed.

The OEL unit 340 comprises a transparent electrode 342, a light-emitting layer 344 and a metal electrode 346. The transparent electrode 342 is electrically connected to the a-Si thin film transistor 320b. The material of the transparent electrode 342 can be indium tin oxide (ITO), aluminum zinc oxide (AZO), indium zinc oxide (IZO) or other transparent metal oxide. The light-emitting layer 344 and metal electrode 346 are sequentially arranged on the transparent electrode 342. The material of the metal electrode 346 can be Ag, Mg/Ag or other metal with high reflectivity. Besides, the light-emitting layer 344 can be a stacked multi-layer structure. The pixel structure 300 of the invention may further comprise a pixel define layer 350 for separating the OEL units 340. The pixel define layer 350 is arranged on the control unit 320 and a portion of the transparent electrode 342.

Please refer to FIGS. 3A and 3B. Among all kinds of light with different wavelength emitted from the OEL unit 340, the red light (640 nm), the green light (515 nm) and the blue light (470 nm) have better transmittance. In other words, the filter structure 330 having many dielectric layers with different refractive indices can purify the light emitted from the OEL unit 340. Because the dielectric layers 332 and 334 of the filter structure 330 is a part of the a-Si thin film transistor 320a and 320b, the characteristics of the a-Si thin film transistor 320a and 320b would not change. The dielectric layer 336 of the filter structure 330 is a multi-layer structure, so it is easier to planarize the dielectric layer 336. Then, the subsequently formed transparent electrode 342, light-emitting layer 344 and metal electrode 346 of the OEL unit 340 would have higher planarity.

According to an embodiment of the invention, after the a-Si thin film transistors 320a and 320b are formed, the dielectric layers 332 and 334 above the OEL unit 340 are removed first, and then the dielectric layer 336 composed of a plurality of dielectric layers is formed. In another embodiment of the invention, only the dielectric layer 332 above the OEL unit 340 is removed, and then the dielectric layer 336 having a plurality of dielectric layers is formed. In another embodiment of the invention, the dielectric layer 336 composed of a plurality of dielectric layers is formed on the OEL unit 340 after the a-Si thin film transistors 320a and 320b are formed.

Second Embodiment

Figure 4A:
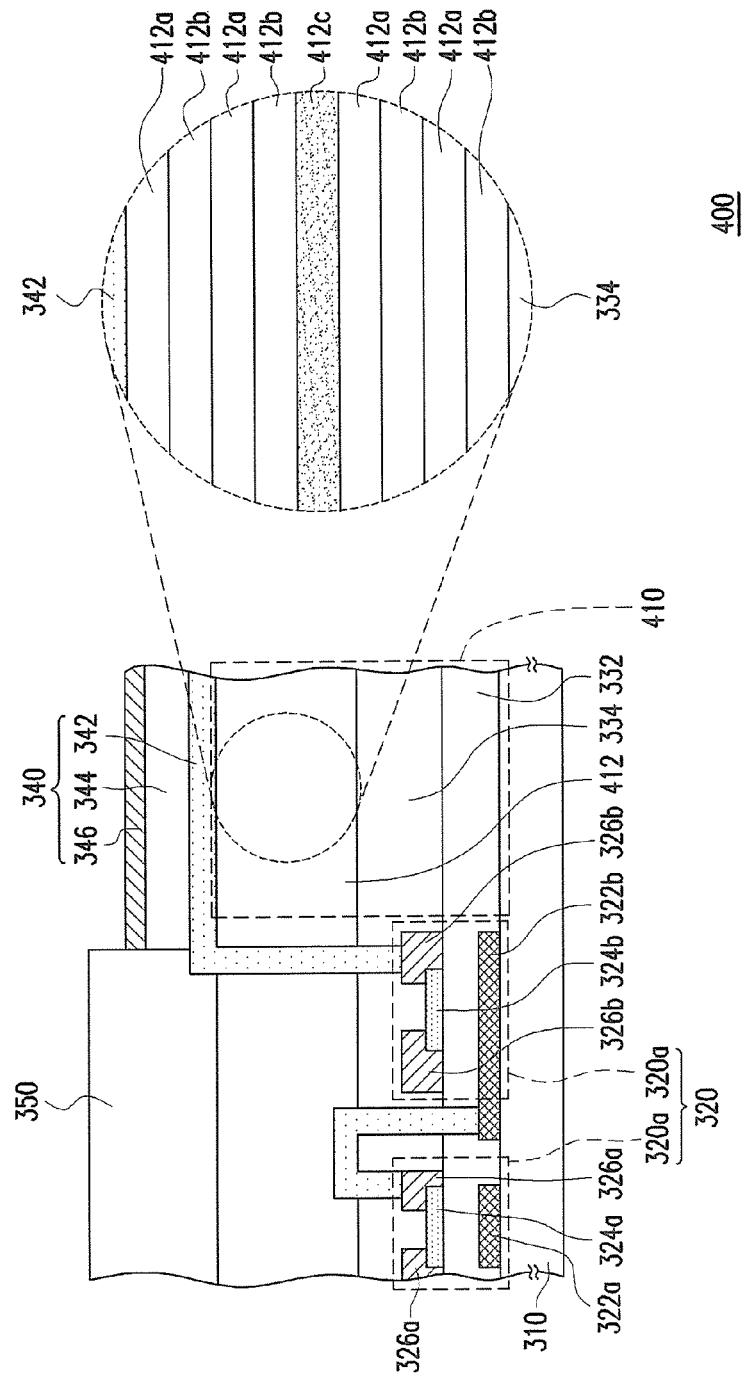
FIG. 4A is a schematic cross-sectional view showing a pixel structure according to the second embodiment of the invention.
Figure 4B:
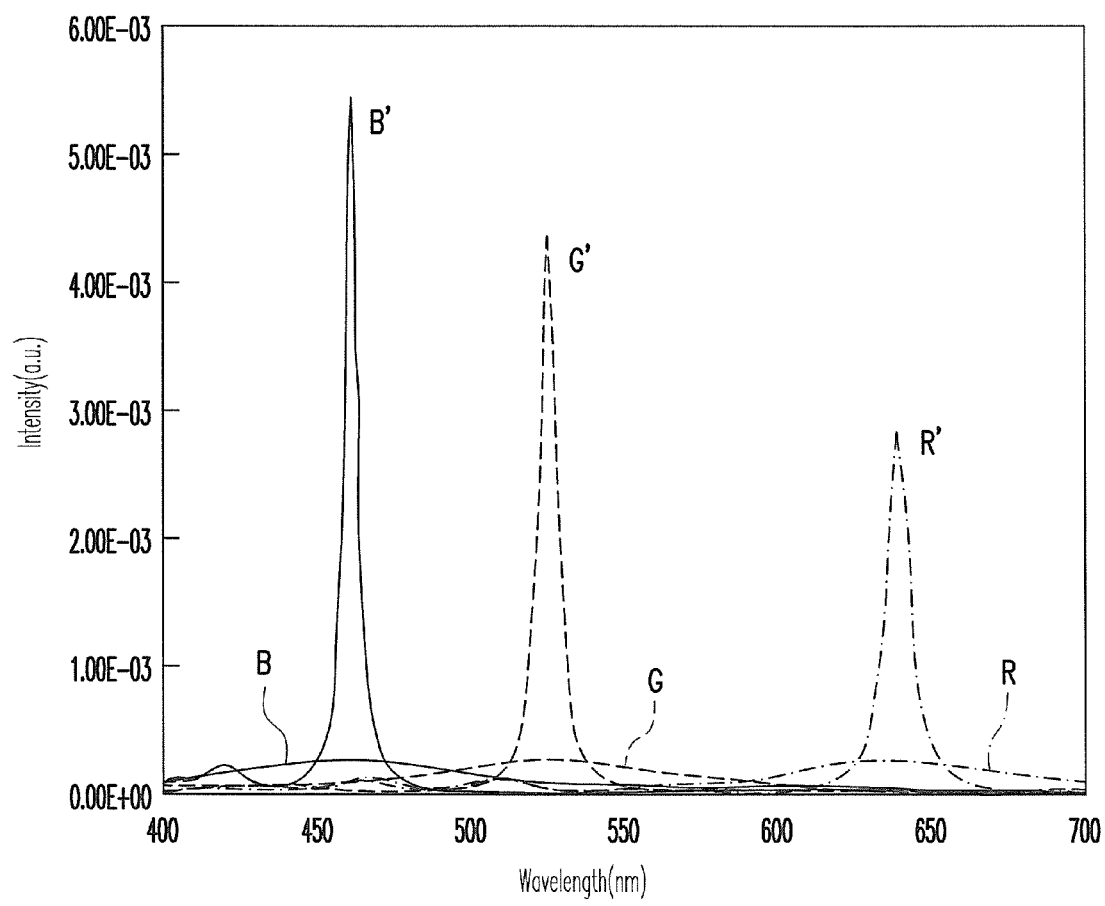
FIG. 4B shows a relationship of the wavelength and transmittance of the pixel structure shown in FIG. 4A.

FIG. 4A is a schematic cross-sectional view showing a pixel structure according to the second embodiment of the invention. FIG. 4B shows a relationship between the wavelength and transmittance of the pixel structure shown in FIG. 4A. Please refer to FIG. 4A. The second embodiment is similar to the first embodiment, but the difference is that the dielectric layers 332, 334 and 412 of the pixel structure 400 are below the OEL unit 340 and form a semi-transparent reflector structure 410. The semi-transparent reflector structure 410 is a distributed bragg reflector (DBR). The total thickness of the dielectric layer 412 can be larger than that of the dielectric layers 332 and 334. Besides, the transparent electrode 342 and the light-emitting layer 344 form a cavity, and the metal electrode 346 becomes a metal mirror while a resonant cavity is formed between the semi-transparent reflector structure 410 and the metal electrode 346. It is noted that the thickness of the transparent electrode 342 varies with the light emitted from the OEL unit 340. For red light, green light and blue light, the thickness of the transparent electrode 342 can be 245 nm, 150 nm and 184 nm respectively.

More specifically, the dielectric layer 412 comprises a plurality of dielectric layers 412a and 412b and a middle layer 412c. The dielectric layers 412a and 412b are alternately stacked, and the refractive index of the dielectric layers 412a is different from that of the dielectric layers 412b. The dielectric layers 412a can be made of silicon nitride, and the dielectric layers 412b can be made of silicon dioxide. The optical thickness of each dielectric layer 412a and 412b is a quarter of a wavelength or N times a quarter of a wavelength, wherein N in an integer. In addition, the middle layer 412c is arranged in the middle of the dielectric layers 412a and 412b, to improve the optical characteristics. The refractive index of the middle layer 412c is larger than that of the dielectric layer 412b. The middle layer 412c can be made of silicon nitride or titania. If the middle layer 412c comprises silicon nitride, the thickness of the middle layer 412c is about 396 nm. And if the middle layer 412c is composed of titania, the thickness of the middle layer 412c is about 350 nm.

As shown in FIGS. 4A and 4B, compared with the light intensity of original red light (R), green light (G) and blue light (B), the red light (R'), green light (G') and blue light (B') traveling through the semi-transparent reflector structure 410 have higher light intensity. In other words, the resonant cavity formed between the semi-transparent reflector structure 410 composed of a plurality of dielectric layers with different refractive indices and the metal electrode 346 can not only purify the light emitted from the OEL unit 340 but also increase the light intensity. Therefore, the semi-transparent reflector structure 410 is in accordance with the filter structure of a specific range of the wavelength. Because the dielectric layer 332 of the semi-transparent reflector structure 410 is also a part of the a-Si thin film transistors 320a and 320b, the characteristics of the a-Si thin film transistors 320a and 320b would not change. Besides, the dielectric layer 412 of the semi-transparent reflector structure 410 is a multi-layer structure, so it is easier to planarize the dielectric layer 412. Then, the subsequently formed transparent electrode 342, light-emitting layer 344 and metal electrode 346 of the OEL unit 340 will have higher surface planarity.

The second embodiment can have various types as the first embodiment. For example, after forming the a-Si thin film transistors 320a and 320b, the dielectric layers 332 and 334 above the OEL unit 340 are removed first, and then the dielectric layer 412 composed of a plurality of dielectric layers is formed. Alternatively, only the dielectric layer 332 above the OEL unit 340 is removed, and then the dielectric layer 412 having a plurality of dielectric layers is formed. Otherwise, the dielectric layer 412 composed of a plurality of dielectric layers is formed on the OEL unit 340 after the a-Si thin film transistors 320a and 320b are formed.

The dielectric layer 412 can only include the dielectric layers 412a and 412b. In the same way, the dielectric layer 412 of the embodiment is composed of four dielectric layers 412a and four dielectric layers 412b. The reflection effect is improved with increased number of the dielectric layers of the semi-transparent reflector structure 410. In addition, the stacking sequence of the dielectric layer 412a and 412b can be appropriately changed.

In summary, the pixel structure of the invention has at least the following advantages:

1. Compared with the prior art, the filter structure or the semi-transparent reflector structure composed of a plurality of dielectric layers with different refractive indices sandwiched between the substrate and the OEL unit can improve the color purity and light intensity of the light emitted from the OEL unit.
2. The a-Si thin film transistor or the LTPS thin film transistor can be part of the filter structure or the semi-transparent reflector structure without affecting the characteristics of the a-Si thin film transistor or the LTPS thin film transistor.
3. Because the filter structure and the semi-transparent reflector structure are both multi-dielectric-layer structure, so they can be easily planarized. And, the subsequently formed OEL units on the filter structure or the semi-transparent reflector structure will have higher surface planarity.

It will be apparent to those skilled in the art that various modifications and variations can be made to the structure of the invention without departing from the scope or spirit of the invention. In view of the foregoing, it is intended that the invention cover modifications and variations of this invention provided they fall within the scope of the following claims and their equivalents.

What is claimed is:

1. A pixel structure on a substrate, comprising:
    a control unit arranged on the substrate;
    an OEL unit arranged on the substrate, the OEL unit comprising a transparent electrode, a light-emitting layer and a metal electrode, wherein the transparent electrode is electrically connected with the control unit, and the light-emitting layer and the metal electrode are sequentially stacked on the transparent electrode; and
    a semi-transparent reflector structure sandwiched between the substrate and the OEL unit, the semi-transparent reflector structure at least comprising a plurality of first and second dielectric layers, a third dielectric layer, and a fourth dielectric layer over the control unit, the first and second dielectric layers being alternately stacked, the refractive index of the first dielectric layers being different from that of the second dielectric layers, the third dielectric layer extending below the bottom of the first and second dielectric layers to the control unit, and the fourth dielectric layer being extended between the bottom of the first and second dielectric layers and the third dielectric layer, wherein the total thickness of the first and second dielectric layers is larger than that of the third and fourth dielectric layers.

2. The pixel structure according to claim 1, wherein the optical thickness of each first and second dielectric layers is N times a quarter of a wavelength, wherein N is an integer.

3. The pixel structure according to claim 1, wherein a material of the first dielectric layers comprises silicon nitride and a material of the second dielectric layers comprises silicon dioxide.

4. The pixel structure according to claim 1, wherein the semi-transparent reflector structure further comprises a middle layer arranged in the middle of the first and second dielectric layers, and the refractive index of the middle layer is larger than that of the second dielectric layers.

5. The pixel structure according to claim 4, wherein a material of the middle layer comprises silicon nitride or titania.

6. The pixel structure according to claim 1, wherein the first dielectric layers and the second dielectric layers are sandwiched between the substrate and the OEL unit, extended in a direction toward the control unit and over the control unit.

7. The pixel structure according to claim 1, wherein the third dielectric layer is a single layer or a multi-layer structure.

8. The pixel structure according to claim 1, wherein the fourth dielectric layer is a single layer or a multi-layer structure.

9. The pixel structure according to claim 1, wherein the control unit comprises a plurality of active devices, and the active devices are electrically connected to each other.

10. The pixel structure according to claim 9, wherein the active devices comprise amorphous silicon thin film transistors or low temperature poly-silicon thin film transistors.

11. The pixel structure according to claim 1, further comprising a pixel define layer arranged upon the control unit and a portion of the transparent electrode.

* * * * *